(12) United States Patent
Okada et al.

(10) Patent No.: US 6,448,492 B1
(45) Date of Patent: *Sep. 10, 2002

(54) TRANSPARENT MEMBER FOR SHIELDING ELECTROMAGNETIC WAVES AND METHOD OF PRODUCING THE SAME

(75) Inventors: Atsushi Okada; Shigenori Kiyama; Takeshi Yoshimi; Toshiyuki Okamoto; Masanori Yamamoto, all of Moriyama (JP)

(73) Assignee: Gunze Limited (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/367,782
(22) PCT Filed: Dec. 22, 1998
(86) PCT No.: PCT/JP98/05836
 § 371 (c)(1),
 (2), (4) Date: Aug. 20, 1999
(87) PCT Pub. No.: WO99/34658
 PCT Pub. Date: Jul. 8, 1999

(30) Foreign Application Priority Data

| Dec. 24, 1997 | (JP) | 9-367108 |
|---|---|---|
| Mar. 4, 1998 | (JP) | 10-071305 |
| Mar. 17, 1998 | (JP) | 10-089313 |
| Oct. 22, 1998 | (JP) | 10-340934 |
| Oct. 22, 1998 | (JP) | 10-340935 |
| Nov. 9, 1998 | (JP) | 10-356858 |

(51) Int. Cl.$^7$ .............................................. H05K 9/00
(52) U.S. Cl. ............................ 174/35 MS; 174/35 R; 348/819; 348/820
(58) Field of Search ..................... 174/35 MS, 35 R, 174/35 GC; 361/818, 816, 799, 800; 348/819, 820; 428/457

(56) References Cited

U.S. PATENT DOCUMENTS

| 4,910,090 A | * | 3/1990 | Kuhlman et al. ............ 428/469 |
| 4,978,812 A | * | 12/1990 | Akeyoshi et al. ...... 174/35 MS |
| 5,076,841 A | | 12/1991 | Chen et al. ................ 106/1.25 |
| 6,030,708 A | * | 2/2000 | Ishibashi et al. ............ 428/441 |
| 6,086,979 A | * | 7/2000 | Kanbara et al. ............ 428/209 |

FOREIGN PATENT DOCUMENTS

| EP | 0161842 | 11/1985 |
| EP | 0817557 | 1/1998 |
| JP | 61149484 | 7/1986 |
| JP | 63195800 | 12/1988 |
| JP | 01170098 | 7/1989 |
| JP | 515494 | 2/1993 |
| JP | 06145396 | 5/1994 |
| JP | 10041682 | 2/1998 |
| JP | 10056289 | 2/1998 |
| JP | 10056290 | 2/1998 |

OTHER PUBLICATIONS

Abstract—WO99/34658, "Transparent Member for Shielding Electromagnetic Waves and Method of Producing the Same", Jul. 8, 1999.

* cited by examiner

Primary Examiner—Dean A. Reichard
Assistant Examiner—Carmelo Oliva
(74) Attorney, Agent, or Firm—Baker Botts LLP

(57) ABSTRACT

The invention provides a transparent member for use as a shield against electromagnetic waves characterized in that an electrically conductive reticular pattern is provided on a substrate (1) by forming a thin-film layer (2) of copper or an alloy thereof on the substrate by physical thin film formation and forming a copper thick-film layer (4) on the thin-film layer by plating so as to give the member a total transmittance of at least 50%, the reticular pattern having an electric resistivity of up to 200 mΩ/□.

21 Claims, 4 Drawing Sheets

TRANSPARENT MEMBER FOR SHIELDING ELECTROMAGNETIC WAVES AND METHOD OF PRODUCING THE SAME

CROSS-REFERENCE TO RELATED APPLICATIONS

This application is a national phase application of International Application No. PCT/JP98/05836, which was filed on Dec. 22, 1998 and which published in Japanese on Jul. 8, 1999, which in turn claims priority from Japanese Applications Nos. 367108/1997 filed Dec. 24, 1997, 71305/1998 filed Mar. 4, 1998, 89313/1998 filed Mar. 17, 1998, 340934/1998 filed Oct. 22, 1998, 340935/1998 filed Oct. 22, 1998, and 356858/1998 filed Nov. 9, 1998.

TECHNICAL FIELD

The present invention relates to improved transparent members for use as shields against electromagnetic waves and a process for producing such members. These transparent members are useful as shields against electromagnetic waves for use with electronic information devices such as plasma display panel, for example, for use as electromagnetic wave shield front filters for plasma display panel. The transparent members have excellent electromagnetic wave shield properties, produces no moire fringes and are excellent in visibility.

BACKGROUND ART

The electromagnetic waves produced by various electronic information devices and those to which such devices are exposed pose the problem of causing the devices to operate erroneously relative to one another and exerting an adverse effect on the human body. The methods of shielding against electromagnetic waves generally under study presently are divided into the following two methods.

One of these methods is a netting method wherein an electrically conductive fiber plated with nickel or copper over the surface is made into a net, which is sandwiched between two substrates or adhered to a substrate with an adhesive.

The other method is coating a substrate with a thin film of ITO (indium tin oxide), silver or the like over the entire surface thereof.

The netting method is generally excellent in electromagnetic wave shield properties, but is low in transparency. This method is further liable to produce moire fringes.

On the other hand, the coating method is satisfactory with respect to transparency and moire fringes but inferior in electromagnetic wave shield properties and especially low in shield properties in the high frequency band because of wavelength dependence.

In the case where the screen of the plasma display panel (PDP) or the like is viewed through an electromagnetic wave shield member, the shield member which must be transparent also needs to fulfill requirements as to visibility, i.e., to assure ease of viewing and not to cause much fatigue to the eyes, even if the screen is viewed therethrough over a prolonged period of time, whereas the two methods are still unsatisfactory in meeting the requirements.

An object of the present invention is to develop a shield member having higher transparency and higher electromagnetic wave shield properties.

Another object of the invention is to develop a shield member which is satisfactory in visibility and adapted to preclude or diminish occurrence of moire fringes.

DISCLOSURE OF THE INVENTION

Figure 1:
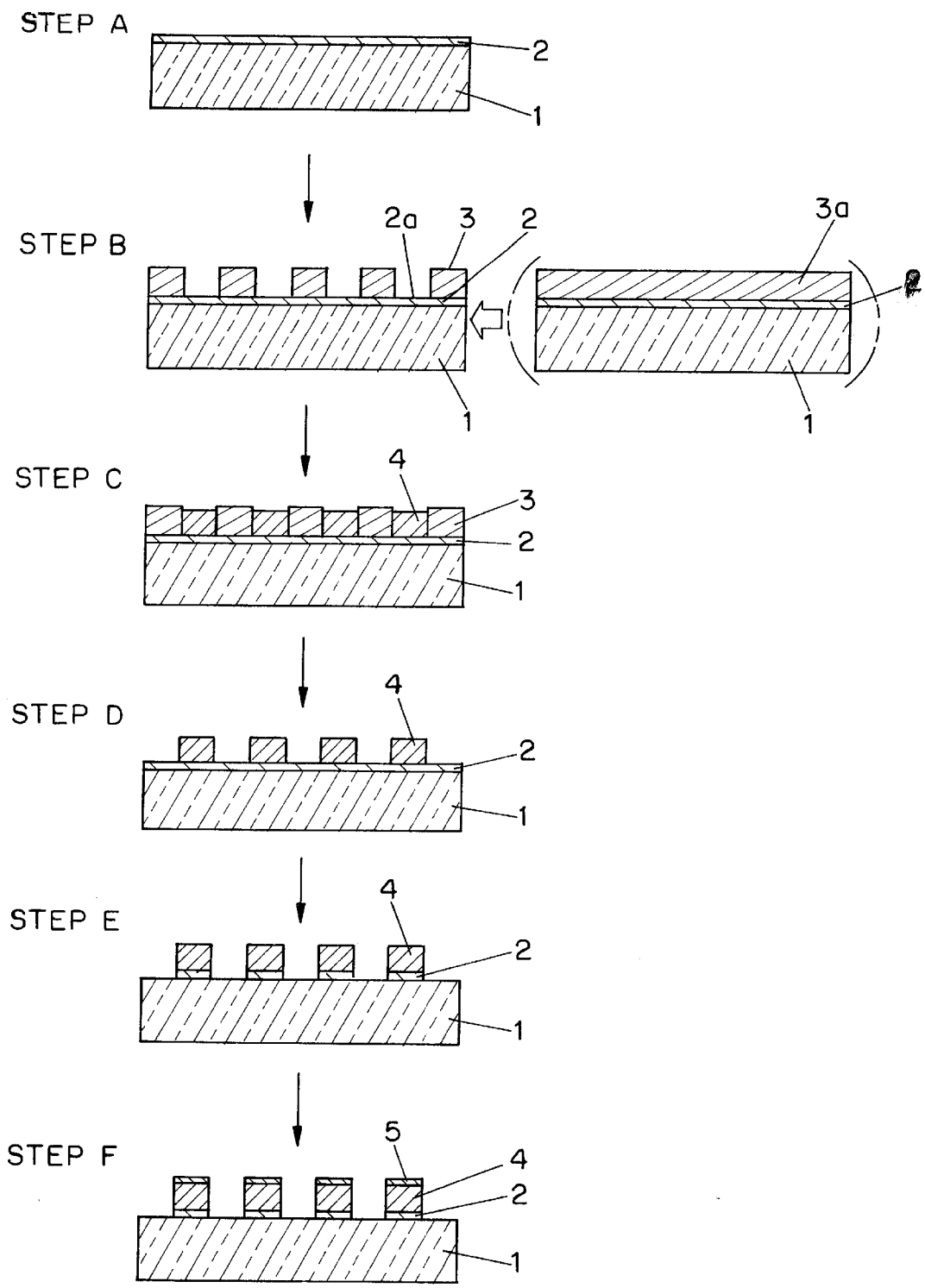
FIG. 1 is a sectional view of a transparent member according to a first aspect of the invention.

The present invention relates to Item 1 to Item 23 given below.

Item 1.

A transparent member for use as a shield against electromagnetic waves characterized in that an electrically conductive reticular pattern is provided on a substrate (1) by forming a thin-film layer (2) of copper or an alloy thereof on the substrate by physical thin film forming means and forming a copper thick-film layer (4) on the thin-film layer by plating means so as to give the member a total transmittance of at least 50%, the reticular pattern having an electric resistivity of up to 200 mΩ/□.

Item 2.

A transparent member for use as a shield against electromagnetic waves according to Item 1 wherein a brown to black colored layer (5) is further formed over the copper thick-film layer (4).

Item 3.

A transparent member for use as a shield against electromagnetic waves according to Item 1 wherein the transparent substrate (1) is a thermoplastic resin sheet having a total transmittance of at least 65%.

Item 4.

A transparent member for use as a shield against electromagnetic waves according to Item 1 wherein the physical thin film forming means is a sputtering process or ion plating process.

Item 5.

A transparent member for use as a shield against electromagnetic waves according to Item 1 wherein the plating means is an electrolytic plating process.

Item 6.

A transparent member for use as a shield against electromagnetic waves according to Item 1 wherein the copper or alloy thin-film layer (2) has a thickness of 100 to 2000 Å.

Item 7.

A transparent member for use as a shield against electromagnetic waves according to Item 1 wherein the copper thick-film layer (4) has a thickness of 1 to 10 µm.

Item 8.

A transparent member for use as a shield against electromagnetic waves according to Item 2 wherein the colored layer (5) comprises a copper oxide or copper sulfide.

Item 9.

A process for preparing a transparent member for use as a shield against electromagnetic waves according to Item 1 which process includes the following steps A to E.

Step A:

The step of sputtering copper or an alloy thereof onto one surface of a sheet of thermoplastic resin having a total transmittance of at least 65% to form a thin-film layer having a thickness of 100 to 2000 Å.

Step B:

The step of developing the thin-film layer by photolithography to expose a reticular pattern.

Step C:

The step of electrolytically plating the reticular pattern with copper to form a copper thick-film layer having a thickness of 1 to 10 μm.

Step D:

The step of removing remaining resist from opening portions of the reticular pattern.

Step E:

The step of chemically etching the entire resulting surface to remove the thin-film layer of copper or alloy thereof from the opening portions of the reticular pattern by dissolving to obtain an electrically conductive reticular pattern comprising the thin-film layer of copper or alloy thereof formed by sputtering and the copper thick-film layer formed by electrolytic plating and superposed on the thin-film layer.

Item 10.

A process for preparing an electromagnetic wave shield transparent member according to Item 9which further includes the following step F.

Step F:

The step of oxidizing or sulfiding the copper surface of the resulting conductive reticular pattern to form a brown to black surface layer of a copper oxide or copper sulfide.

Item 11.

A transparent member for use as a shield against electromagnetic waves comprising a reticular copper pattern (2P) formed on a transparent sheet (21) and consisting predominantly of copper, the reticular copper pattern having a line wide of 1 to 25 μm and an opening ratio of 56 to 96%.

Item 12.

A transparent member for use as a shield against electromagnetic waves according to Item 11 wherein a brown to black colored layer (24) is further formed on the surface of the reticular copper pattern (2P).

Item 13.

A transparent member for use as a shield against electromagnetic waves according to Item 11 wherein the brown to black colored layer (24) comprises a copper oxide or copper sulfide.

Item 14.

A transparent member for use as a shield against electromagnetic waves according to Item 11 wherein the transparent sheet (21) is a thermoplastic resin sheet having a total transmittance of at least 60% and a thickness of 0.05 to 5 mm.

Item 15.

A transparent member for use as a shield against electromagnetic waves according to Item 11 wherein the reticular copper pattern (2P) comprises a copper thin-film layer (22) consisting predominantly of copper, formed by physical thin film forming means and serving as a ground layer, and a copper thick-film layer (23) formed over the copper thin-film layer (22) by plating means.

Item 16.

A transparent member for use as a shield against electromagnetic waves according to Item 11 wherein the copper thin-film layer (22) consisting predominantly of copper has a thickness of 50 Åto 1 μm and the copper thick-film layer (23) has a thickness of 1 to 15 μm.

Item 17.

A transparent member for use as a shield against electromagnetic waves according to Item 11 wherein the reticular copper pattern (2P) has square or rectangular openings.

Item 18.

A transparent member for use as a shield against electromagnetic waves comprising a reticular copper pattern (3P) consisting predominantly of copper and an electrically conductive transparent thin-film layer (32) which are formed over a transparent sheet (31) so as to give a total transmittance of at least 50% to the transparent member.

Item 19.

A transparent member for use as a shield against electromagnetic waves according to Item 18 wherein a brown to black colored layer (33) is further formed on the reticular copper pattern (3P).

Item 20.

A transparent member for use as a shield against electromagnetic waves according to Item 18 wherein the brown to black colored layer (33) comprises a copper oxide or copper sulfide.

Item 21.

A transparent member for use as a shield against electromagnetic waves according to Item 18 wherein the transparent sheet (31) is a thermoplastic resin sheet having a total transmittance of at least 60%.

Item 22.

A transparent member for use as a shield against electromagnetic waves according to Item 18 wherein the reticular copper pattern (3P) is a square or rectangular lattice pattern having a line wide of 1 to 25 μm and an opening ratio of 56 to 96%.

Item 23.

A transparent member for use as a shield against electromagnetic waves according to Item 18 wherein the conductive transparent thin-film layer (32) has a thickness of 100 to 1500 Å.

Figure 2:
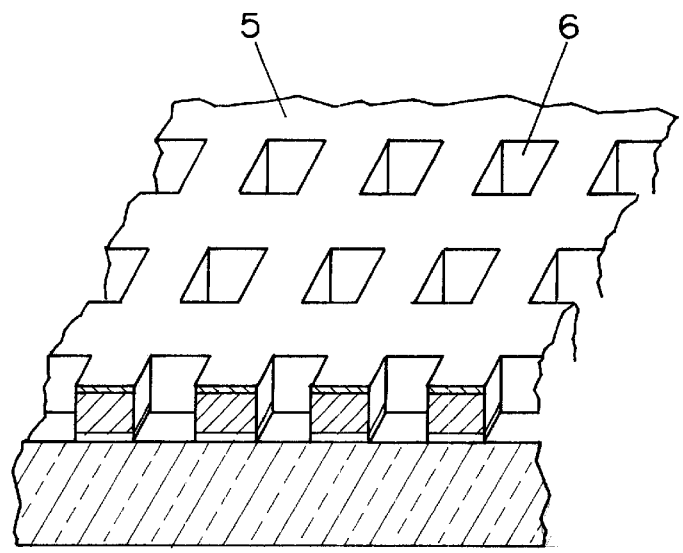
FIG. 2 is a perspective view of the member obtained by step F.
Figure 3:
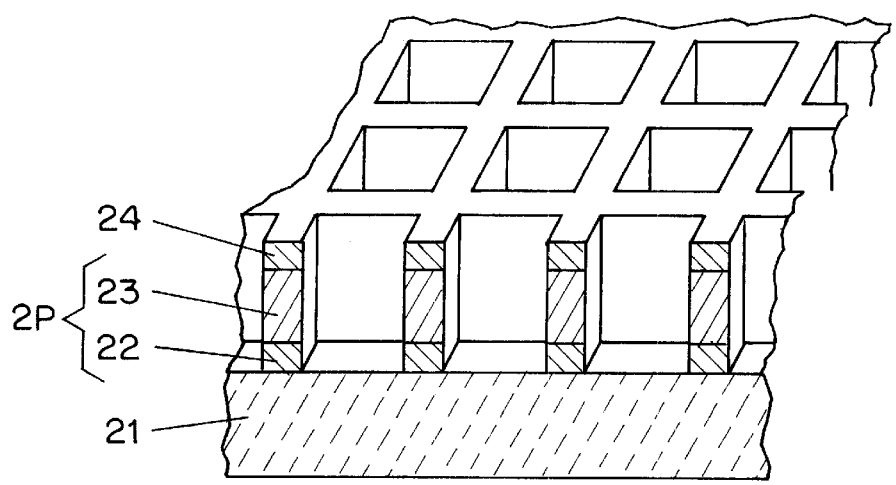
FIG. 3 is a perspective view of a transparent sheet obtained in Example 1B and having high visibility for use as a shield against electromagnetic waves.
Figure 6:
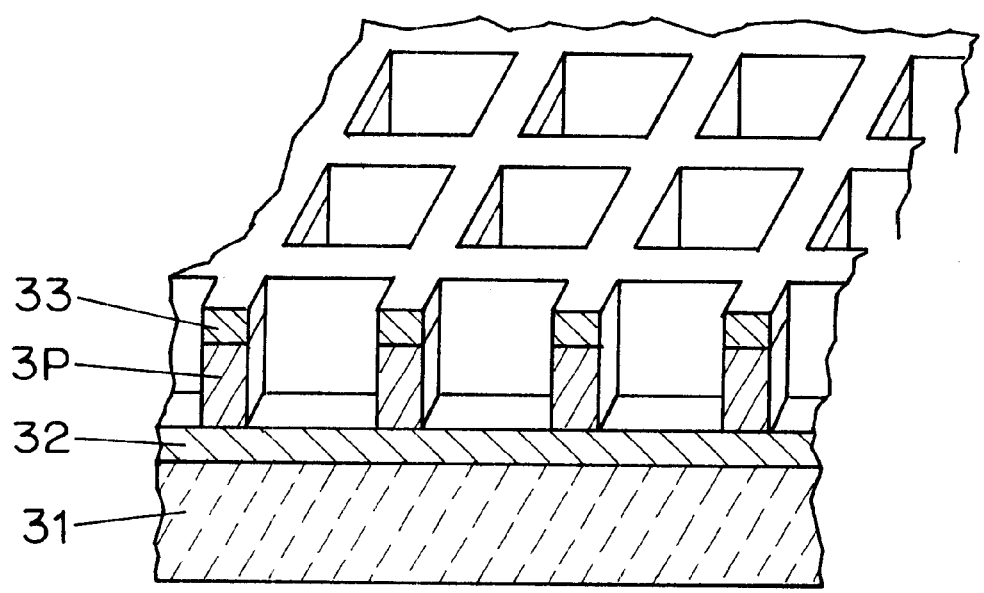
FIG. 6 is a perspective view partly in section of a transparent sheet obtained in Examples 1C to 2C and having high electromagnetic wave shield properties.

A first aspect of the present invention is shown in FIGS. 1 and 2, a second aspect thereof in FIG. 3, and a third aspect thereof in FIG. 6.

According to the first to third aspects of the present invention, examples of materials usable for the substrate-of the electromagnetic wave shield transparent member are inorganic materials such as sheet glass, thermoplastic resins including polymethyl methacrylate, polystyrene or copolymer of styrene and acrylonitrile or methyl methacrylate, poly(4-methylpentene-1), polypropylene or noncrystalline cyclic olefine polymers obtained by homopolymerizing cyclopentene, norbornene, tetracyclododecane or like cyclic olefine monomer or copolymerizing such a monomer with ethylene or the like, polyethylene terephthalate, polyethylene naphthalate, polyarylate, polyether sulfone, polycarbonate and various liquid-crystal polymers, and thermosetting resins including acrylic, urethane, epoxy and silicone resins. Examples of preferred substrate materials are sheet glass or like inorganic materials and thermoplastic resins. Preferably such resins are those excellent in heat resistance, weather resistance, noncontractability, chemical resistance and other mechanical strengths.

The total transmittance of the substrate is usually at least 50%, preferably at least about 60%, more preferably at least about 65%, and most preferably at least about 85%.

The substrate is, for example, in the form of a film or sheet having a thickness of 0.05 to 5 mm. More specifically, examples of substrates are tempered or nontempered inorganic glass sheets having a thickness of 1 to 5 mm, preferably 1 to 3 mm, and films or sheets of thermoplastic resin or thermosetting resin having a thickness of 0.05 to 5 mm, preferably 0.1 to 4 mm, more preferably 0.1 to 3 mm, most preferably 0.1 to 2 mm.

The term "total transmittance" as used herein (and to be hereinafter referred to as "Tt") refers to a value (%) measured by a turbidity meter of the type NDH-20D, manufactured by Nippon Denshoku Kogyo Co., Ltd. according to JIS K7105 (1981). The greater the value, the higher the visibility.

The substrate, which is generally in the form of single sheet or film, may be a composite substrate comprising at least two materials in combination. Further the substrate may be suitably treated, for example, for anti-reflection or for blocking infrared or ultraviolet rays.

The electrically conductive reticular pattern has openings including those shaped like openings of a lattice and having, for example, the same or different widths vertically and horizontally, square or rectangular openings, openings defined by lines obliquely intersecting one another at an angle, i.e., openings in the form of rhombuses, triangles and polygons generally ranging from pentagons to decagons, that is, triangular and pentagonal to decagonal openings.

The conductive reticular pattern, especially the pattern made from copper or made mainly from copper, is 1 to 25 $\mu$m, preferably 3 to 20 $\mu$m, more preferably 5 to 15 $\mu$m, in line width.

Examples of physical thin film forming means are the sputtering process, vacuum evaporation process and ion plating process. These processes are in common in that a metal or nonmetal is made by some method into a vapor or ion, which is applied to the surface of the transparent substrate and deposited thereon in the form of a thin film. The metal to be used in this invention is copper or an alloy thereof.

(1) First Aspect of the Invention

The copper or alloy thin-film layer can be formed by physical thin film forming means such as sputtering, vacuum evaporation or ion plating.

Of these means, sputtering or ion plating is preferable, and sputtering is more preferable.

When copper is used for forming the thin-film layer of copper or an alloy thereof by the thin film forming method, the copper to be used is preferably as pure as possible. Examples of alloys thereof are those consisting predominantly of copper, such as Cu/Zn (brass), Cu/Sn (bronze), Cu/Al, Cu/Ni, Cu/Pd, phosphor bronze and Cu/Be.

The copper thick-film layer can be formed by electrolytic plating or electroless plating. Electrolytic plating is preferable for forming the copper thick-film layer with a required thickness rapidly.

The combination of the copper or alloy thin-film layer and the copper thick-film layer superposed thereon can be chemically etched to form an electrically conductive pattern without substantially involving the reduction of the line width (side etching) that is frequently observed, whereby the desired conductive reticular pattern can be formed with good reproducibility. Accordingly, even if composed of thin lines, the pattern can be given a low electric resistivity, i.e., high transparency and electromagnetic wave shield properties.

The copper or alloy thin-film layer 2 is provided for forming the copper thick-film layer 4, so that the substantial factor for affording electromagnetic wave shield properties resides in the copper thick-film layer. The thin-film layer 2 of copper or alloy thereof is about 100 to about 2000 Å, preferably 300 to 1700 Å, and the copper thick-film layer 4 is about 1 to about 10 $\mu$m, preferably 2 to 8 $\mu$m.

When having a thickness in the above range, the copper or alloy thin-film layer can be rapidly plated (especially electrolytically plated), and the resulting surface can be chemically etched without entailing side etching.

When the copper thick-film layer 4 has a thickness in the above range, the resulting member can be given satisfactory electromagnetic wave shield properties.

The transparent member for use as a shield against electromagnetic waves has an electric resistivity of up to 200 m$\Omega$/$\square$, preferably 5 to 150 m$\Omega$/$\square$, and more preferably 5 to 50 m$\Omega$/$\square$.

The term "electric resistivity" as used herein refers to a value measured for the electrically conductive reticular pattern obtained, using an electric resistance measuring instrument comprising LORESTA (brand name: MCP-TESTERFP) product of Mitsubishi Petrochemical Co., Ltd. and an MCP probe (with four terminals for measurement) specified for use therewith and connected thereto, with the four terminal held in contact with the copper surface of the pattern, the measurement being done at different locations on the surface.

The brown to black colored layer 5 is provided to obtain improved visibility. The layer 5 is colored brown to black, preferably black.

The colored layer 5, which is provided on the copper surface is preferably as thin as possible and firmly bonded to the copper surface in intimate contact therewith. In this sense, the layer is preferably made from a copper oxide or copper sulfide. The copper oxide or copper sulfide can be obtained by oxidizing or sulfiding the copper surface.

The electromagnetic wave shield transparent member is prepared by the process to be described next.

Given below is an especially preferred mode of practicing the process.

The substrate 1 to be used in step A is one of those already mentioned, preferably a sheet of thermoplastic resin which is at least 65% in Tt. Desirable among the examples given is a sheet of polyethylene terephthalate, polyethylene naphthalate or a noncrystalline polyolefin. The sheet to be used is preferably about 0.1 to about 1 mm in thickness in view of handleability and the Tt. Copper or an alloy thereof serving as a target for sputtering is deposited in the form of a thin film having a thickness of 100 to 2000 Å on one surface of the sheet. The sheet need not be pretreated for sputtering, whereas the surface thereof can be cleaned by degreasing or pretreated by glow or corona discharge.

The sputtering, which can be effected under common conditions, is preferably conducted under a low gas pressure of up to $10^{-1}$ to $10^{-2}$ torr (the gas is argon or like inert gas). The low gas pressure sputtering corresponds to sputtering by 3-electrode glow discharge, 2-electrode glow RF discharge, magnetron or ion beam, and is preferably sputtering by magnetron because this method of sputtering forms a thin film at a high rate with a high purity, while resulting in a lower temperature (of up to about 100° C. if highest) within the vacuum chamber of the sputtering apparatus.

The copper or alloy thin-film layer obtained by the above step is subsequently developed by photolithography in step B to expose the desired reticular pattern. Photolithography is a process comprising in sequence the application of a photosensitive resist, vacuum deposition of a masking film, exposure to light, development for the removal of the exposed portion or unexposed portion by dissolving, and formation of desired exposed reticular pattern. The photosensitive resist is of the negative type or positive type. When the negative type is used, only the portion exposed to light and irradiated with ultraviolet rays is cured optically. When the positive type is used which is opposite to the negative type in optical characteristics, the portion exposed to ultraviolet rays is subjected to photodecomposition. When the pattern is treated for development, the unexposed portion is removed by dissolving if the negative type is used, while the exposed portion is removed by dissolving in the case of the positive type. Accordingly, the masking film to be used for the negative type is a positive film (black reticular pattern), while the masking film for the positive type is a negative film (transparent reticular pattern).

Although not particularly specified, the photosensitive resist to be used is generally an acrylic material if it is of the negative type, or a diazo material if it is of the positive type. The resist is generally liquid and may therefore be applied by coating, or may be in the form of a film before use like a dry film.

Further unless the reticular pattern to be obtained is not of fine or minute structure, the pattern can be produced as exposed directly on the thin-film layer by printing instead of photolithography.

The thin layer of the exposed reticular pattern obtained by the steps described and serving as a base is electrolytically plated with copper subsequently in step C to superpose copper on the layer to a thickness of 1 to 10 $\mu$m.

The electrolytic plating is performed substantially under the conditions generally used for copper plating. For example, in the case where a copper sulfate plating bath is used which is prepared mainly from copper sulfate and sulfuric acid, the thermoplastic resin sheet formed with the thin film is immersed in the bath to serve as the cathode, with phosphorus-containing copper serving as the anode, and the thin-film layer is plated at a cathode current density of 0.5 to 6 A/dm$^2$, bath temperature of 15 to 30° C. and plating rate of 0.1 to 1.2 $\mu$m/min. Other process may of course be used, such as copper plating with use of a plating bath consisting mainly of cuprous cyanide and sodium cyanide, i.e., copper cyanide plating, or copper plating with use of a plating bath mainly comprising copper pyrophosphate and potassium pyrophosphate, i.e., copper pyrophosphate plating.

Step D removes the portion of the photosensitive resist layer remaining in the openings of the reticular pattern and left unexposed by the previous step. The resist is removed generally with use of a chemical, such as an organic solvent or aqueous alkali solution, which is applied by spraying or immersion involving a movement.

The resulting sheet is chemically etched in step E over the entire surface thereof at the same time. The chemical etching is performed for a period of time at least until the thin-film layer of copper or alloy thereof is entirely removed from the openings of the reticular pattern by dissolving. The duration of chemical etching varies with the thickness of the thin-film layer. Since the entire surface is chemically etched at the same time, the thickness of the copper plating layer formed by step C is reduced by the chemical etching by an amount corresponding to the thickness of the thin-film layer, whereas the pattern remains substantially unaltered in electric resistivity since the copper thick-film layer formed by electrolytic plating has an exceedingly greater thickness (1 to 10 $\mu$m) than the thin-film layer (100 to 2000 Å in thickness).

The chemical etching of this step is a procedure for chemically dissolving and removing the copper or alloy thereof with an etchant. Accordingly, the etchant is not limited insofar as it dissolves the copper or alloy thereof.

The etchant generally usable is an aqueous solution of ferric chloride or cupric chloride which is usually used, whereas it is desirable to use an etchant which effects milder etching, such as an aqueous solution of the sulfuric acid/hydrogen peroxide type, because if the sputter-deposited very thin layer of copper or alloy thereof is merely removed by the chemical etching from the openings of the reticular pattern, the desired conductive pattern can be spontaneously formed, which differs from a conductive pattern formed by chemically etching a thick copper layer.

The chemical etching is completed within a short period of time, i.e., about 20 to about 50 seconds, and is immediately followed by washing with water and drying to complete the entire process.

The surface of the conductive copper pattern obtained in step E is colored in a different color in step F to give improved visibility. Since the different color is preferably brown to black, a copper oxide or copper sulfide is used for coloring. For coloring with the copper oxide, the pattern is brought into contact with an oxidizer to chemically oxidize the copper surface and form a copper oxide surface film. For coloring with the copper sulfide, on the other hand, the pattern is brought into contact with a sulfiding agent. Since the pattern is thus chemically colored, a color layer of reduced thickness can be formed integrally with the copper surface and will not peel off unlike a colored layer formed anew as by coating with a different material.

Although various oxidizers are available, aqueous solutions of alkaline strong oxidizers are desirable which include, for example, an aqueous solution of sodium chlorite made alkaline with sodium hydroxide. The pattern needs only be immersed in this solution for several minutes.

The color to be given can be changed as desired within the range of from brown to black by altering the sodium hydroxide concentration or sodium chlorite concentration of the aqueous solution or immersion time. The color change appears attributable to the crystal structure of the resulting copper oxide.

Examples of sulfiding agents are aqueous solutions consisting primarily of sulfur or an inorganic compound thereof (e.g. potassium sulfide). Sulfur is ineffective if singly used, so that an aqueous solution is prepared from sulfur and, as added thereto, quick lime, casein and, when required, potassium sulfide serving as an auxiliary agent. On the other hand, potassium sulfide is made into an aqueous solution in combination with ammonium chloride or the like to assure an accelerated reaction. The contact time, temperature, etc. are determined suitably by experiments.

FIG. 1 shows the structure of the transparent member obtained by the treatments of steps A to F. The drawing shows part of the structure in section. Indicated at 1 in the drawing is a sheet of thermoplastic resin at least 65 in Tt, at 2 a thin-film layer obtained by sputtering copper or an alloy thereof, at 2a portions of a reticular pattern exposed by lithography, at 3 remaining portions of a photosensitive resist 3a coating the entire surface, at 4 a copper thick-film layer superposed on the thin-film layer of the exposed portions by electrolytic plating, and at 5 a copper oxide surface layer. FIG. 2 is a perspective view of step F, in which openings are indicated at 6. The Tt varies with the combined area of the openings.

Besides the preferred production process described, for example, copper sputtering and electrolytic plating may be conducted first, followed by photolithography and chemical etching. Alternatively, copper sputtering is conducted first, and the resulting copper thin-film layer is subjected to photolithography and chemically etched to form the thin film into a pattern. The pattern is then electrolytically plated with copper to superpose the copper plating on the pattern portion only. However, the process comprising steps A to E is desirable especially with respect to accurate reproducibility of the original pattern.

The reproducibility of the conductive pattern by the foregoing production process is substantiated by preparing a reticular (latticelike) pattern which is at least 10 $\mu$m in line width, at least 100 $\mu$m in pitch and up to 10 $\mu$m in thickness. The value obtained by dividing 2.54 cm by the pitch is mesh degree.

(2) Second Aspect of the Invention

The reticular copper pattern (2P) to be formed on an electromagnetic wave shield transparent member and consisting predominantly of copper is 1 to 25 $\mu$m, preferably 3 to 20 $\mu$m, and more preferably 5 to 15 $\mu$m, in line width.

The pattern consists predominantly of copper because copper is more effective than other metals from the overall viewpoint of giving electromagnetic wave shield properties (with performance, product quality, ease of fabrication, etc. considered). The wording "consisting predominantly of copper" is used to mean that the pattern is made from copper only or an alloy of copper and other metal. Such alloys include two-component alloys chiefly comprising copper, such as Cu/Zn (brass), Cu/Sn (bronze), Cu/Al, Cu/Ni, Cu/Pd, Cu/Pb and Cu/Be, and three-component alloys chiefly comprising copper, such as Cu/Sn/P (phosphor bronze).

The copper pattern having the foregoing line width is. reticular. This means that the reticular pattern comprises continuous lines consisting predominantly of copper and having a line width of 1 to 25 $\mu$m. Preferably the pattern has latticelike square or rectangular openings, and openings in the form of rhombuses, triangles, polygons ranging from pentagons to decagons, or circles. More preferably, the reticular pattern has square or rectangular openings.

The pattern has an opening (area) ratio of about 56% to about 96%, preferably about 60 to about 90%.

The method of determining the opening ratio will be described with reference to latticelike patterns having square or rectangular openings.

Figure 4:
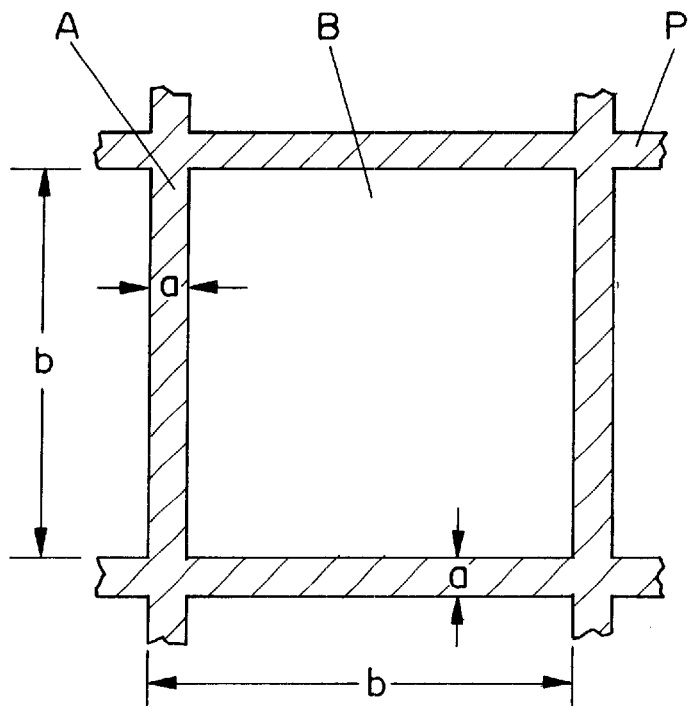
FIG. 4 is a plan view of a reticular pattern having square openings.

First, the pattern with square openings will be described with reference to FIG. 4 and Equation 1. The drawing shows a portion B which is indicated by dot lines and intersecting solid lines and which is an opening. This opening portion B is formed by one component unit A of the copper pattern. Accordingly, the opening ratio of 56 to 96% is given by Equation 1, wherein a is the line width of the copper pattern selected from the range of 1 to 25 $\mu$m, and b is the length ($\mu$m) of one side of the component unit A.

$$\text{Opening ratio} = 100 \times \{(\text{area of } B)/(\text{area of } A)\} \quad \text{(Equation 1)}$$
$$= 100 \times (b-a)^2/(b^2)$$

Figure 5:
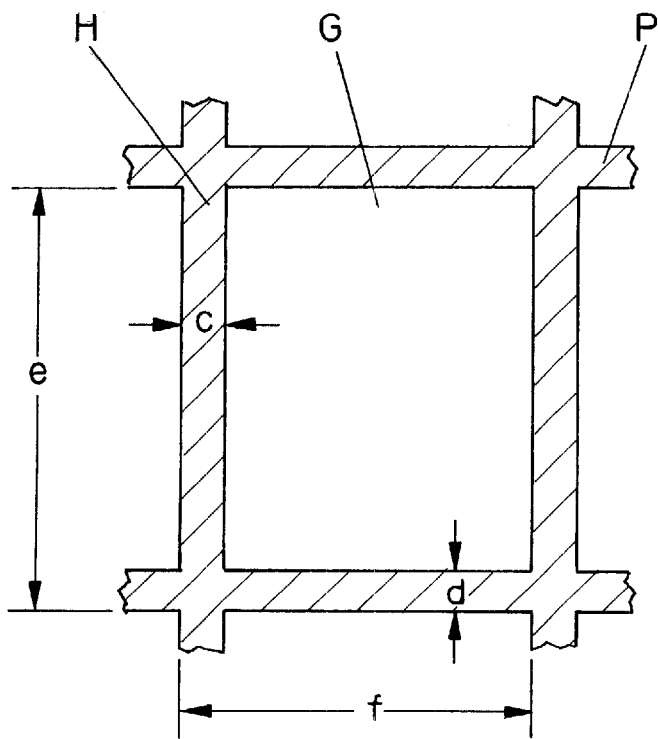
FIG. 5 is a plan view of a reticular pattern having rectangular openings.

Next, the pattern with rectangular openings will be described with reference to FIG. 5 and Equation 2. The drawing shows a portion G which is indicated by dot lines and intersecting solid lines and which is an opening. This opening portion G is formed by one component unit H of the copper pattern P. Accordingly, the opening ratio of 56 to 96% is given by Equation 2, wherein c and d are each a line width of the copper pattern selected from the range of 1 to 25 $\mu$m, generally c=d but c is not always equal to d, and e and f are the length ($\mu$m) of long side of the component unit H and the length ($\mu$m) of short side thereof, respectively.

$$\text{Opening ratio} = 100 \times \{(\text{area of } G)/(\text{area of } H)\} \quad \text{(Equation 2)}$$
$$= 100 \times \{(e-d) \times (f-c)\}/(f \times e)$$

The electromagnetic wave shield transparent member according to the second aspect of the invention thus constructed is produced by the process to be described below. Three examples of this process will be described below, but these examples are not limitative.

The first of these examples uses a copper-laminated sheet obtained by laminating copper foil to the transparent sheet with a transparent adhesive. This sheet is coated with a photosensitive resist, a mask bearing an image of desired reticular pattern is then vacuum-deposited on the resist coating, followed by photoetching (exposure to light-development-chemical etching) to form on the transparent sheet a reticular copper pattern having a line width of 1 to 25 $\mu$m and an opening ratio of 56 to 96%.

The second example is a process comprising forming an anchor layer (for example, of a hydrophilic resin such as polyhydroxyethyl acrylate) on the transparent sheet for forming plating nuclei for electroless plating, forming an electroless plating layer over the anchor layer with use of palladium as a catalyst for chemical plating, treating the plating layer with a copper electroless plating bath to form a copper layer having a thickness of 1 to 10 $\mu$m over the entire surface of the plating layer, and photoetching the resulting copper layer as in the foregoing case of copper foil to form on the transparent sheet a reticular copper pattern having a line width of 1 to 25 $\mu$m and an opening ratio of 56 to 96%.

The third example provides a reticular copper pattern having a line width of 1 to 25 $\mu$m and an opening ratio of 56 to 96% and formed on the transparent sheet. The reticular copper pattern comprises a copper thin film consisting predominantly of copper and formed as a lower layer by physical thin film forming means, and a thick-film layer of copper superposed on the copper thin film by plating means.

More specifically stated, the following two processes can be exemplified as the process of third example. With the first of these processes, a thin-film layer is formed on the transparent sheet by physical thin film forming means, e.g., by sputtering, vacuum evaporation or ion plating, the thin-film layer consisting predominantly of copper and having a thickness of about 50 Å to about 1 $\mu$m, preferably 100 Å to 0.7 $\mu$m. Next, a copper thick-film layer, about 1 to about 10 $\mu$m in thickness, is formed over the entire surface of the thin-film layer by plating, for example, by electrolytic plating. Finally, the copper thick-film layer is converted into the desired reticular pattern by photoetching.

The other process uses physical thin film forming means to form on a transparent sheet a thin-film layer consisting predominantly of copper and having a thickness of about 50 Å to about 1 $\mu$m, preferably 100 Å to 0.7 $\mu$m, as in the above process. With use of a mask having a reticular pattern, the thin-film layer is subjected to photolithography (steps including exposure to light of the masked layer through development) to obtain an exposed pattern. The opening portions of the pattern remain masked with the photoresist. The exposed pattern is then plated over the thin-film layer with copper by plating means to superpose a pattern layer having a thickness of about 1 to about 10 $\mu$m. The resist remaining in the pattern opening portions is then removed with a solvent. Finally, the entire resulting surface is chemically etched to remove the thin-film layer in the pattern opening portions, whereupon etching is discontinued. Since the entire surface is chemically etched, the copper plating forming the pattern is etched at the same time. However, the thin-film layer in the pattern opening portions is etched at a much higher rate, so that the reduction in the thickness of copper of the thick film formed by plating is extremely small, permitting the layer to retain its substantial thickness and to remain free of side etching.

Preferable among the three exemplary processes is the combination of physical thin film forming means and plating means of the third example.

A description will be given of an electromagnetic wave shield transparent member provided with a brown to black colored layer 24. The colored layer which is formed on the surface of the copper thick-film upper layer and which gives a brown to black color to the shield transparent member renders the screen of a PDP or the like easy to view when the screen is seen through the shield member, and is unlikely to cause much fatigue to the eyes even if the screen is viewed continuously for a prolonged period of time. Thus the colored layer imparts visibility in a sense different from the improved visibility available by precluding the occurrence of moire fringes. The brown to block color means the range of pure brown to pure black and further a range of suitable mixtures of the two colors, whereas a blackish brown color wherein much black is added is more preferable than pure brown.

The means for providing the colored layer 24 is not limited; for example, there are the following three methods.
(i) Coating the surface of the reticular copper pattern with a coating resin composition obtained by mixing a brown to black coloring pigment to a coating resin.
(ii) In forming the reticular copper pattern by photoetching, a photosensitive resist is used which is colored brown or black in advance, and the resist remaining on the copper pattern is left as it is without being removed.
(iii) A chemical method wherein the reticular copper pattern is oxidized or sulfided to convert the surface to a copper, oxide or copper sulfide.

Of these three methods, the chemical method (iii) resorting to oxidizing or sulfiding treatment is preferable because unlike the other two methods, the colored layer of this method is formed integrally with the copper pattern layer and therefore bonded to the copper in intimate contact therewith, and further because the thickness and color tone of the copper oxide or copper sulfide surface layer can be altered as desired merely by varying the oxidizing or sulfiding condition.

The oxidizing treatment can be performed, for example, by immersing the shield transparent member obtained in an aqueous solution of sodium chlorite made alkaline with sodium hydroxide, i.e., in an alkaline strong oxidizer aqueous solution, to convert the copper to a copper oxide. The optimum treating conditions (temperature, immersion time, alkali concentration, sodium chlorite concentration, etc.) are to be determined by experiments in advance. The sulfiding treatment is conducted by bringing the shield transparent member into contact, for example, with an aqueous solution chiefly comprising sulfur or an inorganic compound thereof (e.g., potassium sulfide). Sulfur is ineffective if singly used, so that an aqueous-solution is prepared from sulfur and, as added thereto, quick lime, casein and, when required, potassium sulfide serving as an auxiliary agent. On the other hand, potassium sulfide is made into an aqueous solution in combination with ammonium chloride or the like to assure an accelerated reaction. In either case, the contact time, temperature, etc. are determined suitably by experiments. Although the thickness of the copper oxide or copper sulfide surface layer can be varied as desired by altering the oxidizing or sulfiding conditions, too great a thickness will give the copper pattern an increased electric resistivity, consequently entailing impaired electromagnetic wave shield effectiveness. Accordingly, the copper oxide or sulfide surface layer is given such a thickness that the resistivity is not greater than about 200 m$\Omega$/□.

(3) Third Aspect of the Invention

A reticular copper pattern 3P consisting predominantly of copper and an electrically conductive transparent thin-film layer 32 are formed over a substrate 31 so as to give a Tt of at least 50%, preferably at least 60%, to the entire transparent member eventually obtained.

The reticular copper pattern 3P will be described.

The pattern consists predominantly of copper because copper is more effective than other metals from the overall viewpoint of giving electromagnetic wave shield properties (with performance, product quality, ease of fabrication, etc. considered). The wording "consisting predominantly of copper" is used to mean that the pattern is made from copper only or an alloy of copper and other metal. Such alloys include two-component alloys chiefly comprising copper, such as Cu/Zn (brass), Cu/Sn (bronze), Cu/Al, Cu/Ni, Cu/Pb and Cu/Be, and three-component alloys chiefly comprising copper, such as Cu/Sn/P (phosphor bronze).

The pattern has continuous copper lines consisting predominantly of copper and defining openings of particular shape in a regular reticular arrangement. More specifically, the copper pattern has latticelike square or rectangular openings, rhombic or circular openings, or openings each in the form of a triangle or one of polygons ranging from pentagons to decagons. Preferable among these examples is the latticelike copper pattern having square or rectangular openings.

The pattern has a line width of 1 to 25 $\mu$m, preferably 3 to 20 $\mu$m, and more preferably 5 to 15 $\mu$m. The pattern has 56 to 96%, preferably 60 to 90% of openings.

The opening ratio can be determined from Equations 1 and 2 as in the foregoing case.

Incidentally, the reticular copper pattern needs to have a greater thickness than the conductive transparent thin-film layer 32 so as to exhibit the greatest possible electromagnetic wave shield effectiveness, whereas too great a thickness fails to achieve improved effectiveness. In this sense, it is desirable to give the pattern a thickness of about 0.5 to about 10 $\mu$m, preferably 1 to 7 $\mu$m.

The conductive transparent film layer 32 will be described next. This layer is formed beneath or over the, reticular copper pattern 3P to extend along the entire area thereof. While the layer is formed from a transparent conductive material of low resistivity, the transparency is preferably such that the transparent member in its entirely has the highest possible Tt which is not smaller than 50%. Preferable as the material is one assuring facilitated formation of the thin-film layer and satisfactorily bondable to the substrate 31 and to the reticular copper pattern 3P. The conductive transparent film layer 32 is 100 to 1500 Å, preferably 150 to 1200 Å in thickness.

Examples of materials which are transparent and electrically conductive and from which the thin-film layer can be formed easily are elemental metals such as silver, platinum, aluminum and chromium, metallic oxides such as indium oxide, stannic oxide, zinc oxide and cadmium oxide, indium tin oxide (ITO) obtained by doping indium oxide with tin, antimony tin oxide (ATO) obtained by doping stannic oxide with antimony, fluorotin oxide (FTO) obtained by doping stannic oxide with fluorine, aluminum zinc oxide (AZO) obtained by doping zinc oxide with aluminum, composite oxide of indium oxide and zinc oxide, etc. Preferable among these are metallic oxides or metallic oxides containing a dopant. ITO is especially preferred.

The transparent sheet having high electromagnetic shield properties is prepared by the process to be described below. However, this process is not limitative; for example, the following four processes can be used.

The first of these processes comprises forming an anchor layer (of a hydrophilic resin such as polyhydroxyethyl acrylate) on one surface of the transparent substrate 31 for forming plating nuclei for electroless plating, forming an electroless plating layer over the anchor layer with use of palladium as a catalyst for chemical plating, and treating the plating layer with a copper electroless plating bath, followed by electroless copper plating as the case may be, to form a copper layer having a thickness of 1 to 10 μm over the entire surface of the plating layer. Subsequently, a reticular copper pattern is formed by the common photoetching process using a masking film having the desired reticular pattern.

A conductive transparent thin-film layer 32 is then superposed on the entire resulting surface including the reticular copper pattern. Although the method of forming the thin-film layer is not particularly limited, it is desirable to form the layer by physical thin film forming means, such as vacuum evaporation, sputtering or ion plating, using the conductive material exemplified above. Preferable among these means or processes is sputtering because this process is capable of forming the conductive transparent thin-film layer of high quality rapidly.

The second process uses a copper-laminated sheet obtained by laminating copper foil to the transparent substrate 31 with an adhesive. More specifically, the copper-laminated surface is made into the desired reticular copper pattern by photoetching in the same manner as in the first process described-above. A conductive transparent thin film is further formed on the entire surface over the pattern by physical thin film forming means.

With the third process, a reticular copper pattern 3P is provided on the transparent substrate 31 by plating a thin copper film, consisting predominantly of copper and serving as a ground layer, with copper in the form of a thick film as by electrolytic plating. A conductive transparent thin-film layer 32 is superposed on the entire resulting-surface over the copper pattern 3P in the same manner as above.

Incidentally there are two processes I and II described below for forming the copper pattern itself.

Process I forms a thin-film layer having a thickness of 50 Å to 1 μm, preferably 100 Å to 0.7 μm, on the surface of the transparent substrate 31 by the physical thin film forming means using the aforementioned copper material consisting predominantly of copper. The thin-film layer is then electrolytically plated with copper over the entire surface thereof to superpose a thick-film layer, 1 to 10 μm in thickness. Finally the resulting surface is photolithographically photoetched using a masking film having an image of desired reticular pattern, whereby a reticular copper pattern is formed which comprises two layers, i.e., the copper thin-film layer serving as a ground layer and the copper thick-film layer superposed thereon.

Process II first forms a thin-film layer consisting predominantly of copper and having a thickness of 50 Å to 1 μm, preferably 100 Å to 0.7 μm, on the surface of the transparent substrate 31 by physical thin film forming means. The thin-film layer is then photolithographically developed using a masking film having an image of desired reticular pattern to produce an exposed pattern. The opening portions of the pattern are held masked with a photosensitive resist in this step. Subsequently the thin-film layer of the exposed pattern is electrolytically plated with copper to superpose a thick-film pattern layer, 1 to 10 μm in thickness. The remaining resist film is then removed from the pattern opening portions with a solvent.

The entire resulting surface is thereafter chemically etched to remove the thin-film layer from the pattern opening portions by dissolving, whereupon the etching is discontinued. Since the entire surface is chemically etched, the plated copper already forming the pattern is also etched. However, the thin-film layer in the pattern opening portions is etched away at an exceedingly higher rate, so that the plated copper forming the thick film diminishes slightly, substantially retaining the original thickness.

The fourth process forms a reticular copper pattern 3P over a conductive-transparent thin-film layer 32 as a lower layer. Stated more specifically, an electrically conductive transparent thin film 32 is first provided over the entire area of one surface of the transparent substrate 31 by physical thin film forming means using the aforementioned conductive material. The thin film is then developed by photolithography using a masking film bearing an image of desired reticular pattern to expose to light the thin-film portion corresponding to the pattern, with the pattern opening portions held masked with a photosensitive resist.

Subsequently, the exposed portion (conductive transparent thin-film portion) forming the pattern is electrolytically plated with copper to a thickness of 1 to 10 μm. Finally, the remaining resist is removed from the pattern opening portions by peeling (or dissolving).

Thus, the process forms a structure comprising a conductive transparent thin-film layer 32 provided as a lower layer over the entire substrate surface, and a desired reticular copper pattern 3P formed over the lower layer.

In the case where the conductive thin-film layer 32 is to be electrolytically plated with copper, problems may arise, for-example, as to the electrolytic plating environment (amenability to the passage of current, resistance to the electrolytic plating bath) and bondability of the copper plating to the thin-film layer depending on the material of this layer. In such a case, various tests need to be carried out in advance to determine the pretreatment conditions for bonding. For example, if the thin-film layer is prepared from ITO, the layer is low in bondability to the plating layer, so that the ITO layer is electrolytically plated with palladium and with nickel first and is subsequently electrolytically plated with copper.

Among the four processes described, the third and fourth processes require no adhesive layer and are therefore desirable.

A brown to black color is selected especially for the colored layer 33.

The term "brown to black color" means the single color of brown or black, or a suitable mixture of the two colors. A blackish brown mixed color wherein black is predominant is desirable.

Specifically stated, the layer is colored, for example, by the fifth to seventh processes given below.

Fifth process: coating the surface of the reticular copper pattern 3P with a thin film of a resin composition prepared by admixing a brown to black pigment with a coating resin.

Sixth process: Using a colored photosensitive resist in forming the reticular copper pattern P by photoetching and allowing the resist to remain on the copper pattern as it is without being removed.

Seventh process: Chemical process wherein the reticular copper pattern 3P is oxidized or sulfided to convert the surface to a copper oxide or copper sulfide.

The seventh process is desirable.

The oxidizing treatment can be performed, for example, merely by immersing the reticular copper pattern 3P obtained in an aqueous solution of sodium chlorite made alkaline with sodium hydroxide, i.e., in an alkaline strong oxidizer aqueous solution, whereby the surface can be readily converted to a copper oxide. The optimum treating conditions (temperature, immersion time, alkali concentration, sodium chlorite concentration, etc.) are to be determined by testing in advance.

For the sulfiding treatment, the copper pattern surface is brought into contact, for example, with an aqueous solution chiefly comprising sulfur or an inorganic compound thereof (e.g., potassium sulfide). Sulfur is ineffective if singly used, so that an aqueous solution is prepared from sulfur and, as added thereto, quick lime, casein and, when required, potassium sulfide serving as an auxiliary agent. On the other hand, potassium sulfide is made into an aqueous solution in combination with ammonium chloride or the like to assure an accelerated reaction. In either case, the contact time, temperature, etc. are determined suitably by experiments. Although the thickness of the copper oxide or copper sulfide surface layer can be varied as desired by altering the oxidizing or sulfiding conditions, too great a thickness will give the copper pattern an increased electric resistivity, consequently entailing a tendency toward impaired electromagnetic wave shield effectiveness. Accordingly, it is desirable to give the smallest possible thickness to the copper oxide or sulfide surface layer so that the resistivity will not exceed about 200 m$\Omega$/□.

As already described, the conductive transparent thin-film layer 32 to be provided over the entire area may be formed beneath or over the reticular copper pattern 3P, while the layer 32 can be provided alternatively as upper and lower two layers holding the pattern therebetween. The two layers thus formed are expected to afford further improved electromagnetic wave shield properties and provide protection for the pattern.

BEST MODE FOR CARRYING OUT THE INVENTION

The present invention will be described in greater detail with reference to Examples and Comparative Examples. The electromagnetic wave shield properties, total transmittance Tt and moire fringes are measured by the following methods.

The shield properties are expressed in terms of the attenuation (dB-decibel) of electromagnetic waves as measured in the frequency range of 100 to 1000 MHz (megahertz) by the method of Kansai Denshi Kogyo Shinko Center Foundation (generally called the KEC method).

The total transmittance Tt is transmittance (%) measured by a turbidity meter of the type NDH-20D, manufactured by Nippon Denshoku Kogyo Co., Ltd. according to JIS K7105 (1981).

The shield transparent member obtained was installed in front of the screen of a PDP as spaced apart therefrom by 10 mm and observed with the unaided eye to check the member for the appearance of moire fringes. The degree of occurrence of fringes is evaluated according to three criteria; occurrence of no fringes or failure to identify fringes is represented by a double circle mark ⊚, slight occurrence of fringes acceptable to actual use by a circle mark ○, and apparent occurrence of fringes unacceptable to actual use by a cross mark x.

The opening ratio was determined from Equations 1 and 2 already described herein. The transparent member was also checked for visibility.

EXAMPLE 1A

A biaxially oriented polyethylene terephathlate film (hereinafter referred to as "PET film"), 125 $\mu$m in thickness, 400×1000 mm in size and 90% in Tt, was first pretreated by glow discharge before sputtering. The pretreated PET film was disposed as opposed to a copper target within the vacuum container of a magnetron sputtering apparatus, and the air in the container was replaced completely by argon to obtain a vacuum of 2×10$^{-3}$ torr, in which with application of DC voltage of 9 kW, the copper was deposited on the film at a rate of 1 m/min repeatedly three times.

A copper thin film was obtained with a uniform thickness of 1200 Å (±100 Å). A portion of the film was cut off and subjected to a tape peel test, but the copper thin film was unlikely to peel off.

The copper-deposited surface of the PET film obtained was then coated with a resist of the positive type. by a roll coater to form a resist layer with a thickness of 5 $\mu$m. A negative film bearing an image of reticular pattern (170-mesh), 15 $\mu$m in line width and 150 $\mu$m in pitch, was then held in intimate contact with the surface of the resist layer under vacuum and thereafter exposed to light. (The negative film was a masking film having a transparent pattern with block opening portions, and a superhigh-pressure mercury lamp was used as a light source for irradiating the film with 130 mJ/cm$^2$.) With the resist of the reticular pattern portion decomposed by the exposure, this resist portion was dissolved with a developer for removal, followed by washing with water and drying. The resist in the pattern opening portions remained in intimate contact with the copper-deposited surface. Accordingly, the opening portions were masked, with the copper-deposited layer exposed at the pattern portion.

Next, the exposed reticular pattern was electrolytically plated with copper using phosphorus-containing copper as the anode, the pattern as the cathode and a mixture of copper sulfate, sulfuric acid and water as the plating bath, under the conditions of a bath temperature of 23° C., a cathode current density of 1.7 A/dm$^2$ and a plating rate of 0.3 $\mu$m/min. The PET film thus plated was thoroughly washed with water and dried.

The entire plated surface was lightly brushed while applying a jet of acetone thereto to remove the remaining resist from the pattern opening portions by dissolving, followed by washing with water and drying. A portion of the resulting sheet was cut off, and the cut section was observed as enlarged under a microscope to find that the superposed copper plating layer was in the form of very sharp prisms measuring 15.1 $\mu$m in width and 4.9 $\mu$m in thickness (height). The copper plating layer superposed in the form of very sharp prism appears attributable to the presence of the photoresist which forms accurately shaped frames, permitting the copper to be deposited along the frames.

Subsequently, the copper plated sheet was immersed in acetone to remove the remaining resist from the pattern opening portions by dissolving, followed by washing with water and drying. The entire resulting surface was thereafter etched under the following conditions.

An aqueous solution containing sulfuric acid and hydrogen peroxide was used as a chemical etchant as placed in a bath, and the surface was etched with stirring for 30 seconds. Upon lapse of 30 seconds, the sheet was immediately washed with water and dried. A 170-mesh sharp conductive pattern was formed on the PET film. Even if the resulting sheet was bent through 180 deg, there was no likelihood of the pattern separating off. The conductive pattern formed was 15 μm in line width and 4.8 μm in thickness.

Incidentally the pattern was in the form of prisms and was free of any side etching. Table 1 shows the electric resistivity, electromagnetic wave attenuation and Tt of the sheet obtained.

TABLE 1

| Example | Electric resistivity (mΩ/□) | Electromagnetic wave attenuation (dB) | | | Tt (%) |
| --- | --- | --- | --- | --- | --- |
| | | 100 MHz | 500 MHz | 1000 MHz | |
| Ex 1A | 15.7 | 48 | 48 | 50 | 66.1 |
| Ex 2A | 15.4 | 41 | 41 | 47 | 68.1 |
| Comp. Ex. 1A | 204 | 15 | 19 | 7 | 83.0 |

EXAMPLE 2A

A conductive reticular pattern of copper was first formed on a PET film by a sequence of steps in the same manner as in Example 1A with the exception of the following conditions.

The thin-film layer formed by sputtering copper was 1700 Å in thickness.

The coating of the resist of the positive type was 7 μm in thickness.

The negative film had an image of reticular pattern (101-mesh), 25 μm in line width and 250 μm in pitch.

The electrolytic plating of copper was 6.8 μm in thickness.

The duration of chemical etching was 50 seconds.

The conductive pattern thus obtained was 6.6 μm in thickness, 25.0 μm in line width and free of any side etching and found to be in the form of sharp prisms when the pattern was observed in section.

To color the surface of the conductive copper pattern thus formed brown to black, the resulting sheet was then immersed in its entirety in an oxidizing bath, i.e., an aqueous solution of sodium hydroxide and sodium chlorite at 70° C. for 5 minutes, Upon lapse of 5 minutes, the sheet was taken out of the bath, washed with water and dried. The copper surface of the pattern changed to blackish brown, and the colored layer was about 0.52 μm in thickness. Table 1 shows the electric resistivity, electromagnetic wave attenuation and Tt of the sheet.

The PET film bearing the colored conductive pattern thereon thus obtained was held suspended in front of the screen of a plasma display at a distance of 10 mm therefrom. When viewed through the film, images on the screen were visible with greater ease than through the uncolored sheet of Example 1A without a feeling of visual fatigue.

EXAMPLE 3A

First, a conductive reticular pattern of copper layer was formed on a PET film under the same conditions as in Example 2A. The pattern was then held in contact with a sulfiding bath at 40° C. for 60 seconds, the bath being prepared by adding quick lime, casein and potassium sulfide to sulfur serving as the main component and dissolving the mixture in distilled water. The film was then immediately withdrawn from the bath, washed with water and dried. The pattern was colored black, and the color was vivider and darker than in Example 2A. Of course, the coloring means produced no adverse effect on the pattern.

COMPARATIVE EXAMPLE 1A

A PET film bearing a conductive pattern thereon for comparison was prepared by a sequence of steps under the same conditions as in Example 1A with the exception of the following conditions.

The negative film had an image of reticular pattern (195-mesh), 13 μm in line width and 200 μm in pitch.

The electrolytic copper plating layer was 0.8 μm in thickness.

The conductive copper pattern formed on the PET film was 10 to 12 μm in line width and 0.6 to 0.67 μm in the thickness of copper and was not uniform. The variations are thought attributable to the side etching involved in the chemical etching and the irregularities involved in electrolytic copper plating because the reticular pattern was too small in line width and also because the copper plating was too small in thickness.

Table 1 shows the electric resistivity, electromagnetic wave attenuation and Tt of the sheet obtained.

The transparent member of the invention for use as a shield against electromagnetic waves is usable as it is, but is preferably provided with a protective film over the entire surface thereof in view of the fact that the pattern is formed of copper and to provide protection against possible damage due to an external force. The protective film to be selected of course needs to have high bondability and must also be excellent in transparency, ability to act as a barrier against water and oxygen, impact resistance, heat resistance, resistance to chemicals, etc. Examples of useful films are those of curable organic substances of the acrylic, urethane and silicone type, and inorganic compounds typical of which is silicon dioxide.

The protective film of silicon dioxide, which is more preferable than those of organic materials, can be physically formed by sputtering silicon dioxide, but can alternatively be formed chemically by coating the transparent member with a solution of perhydropolysilazane and decomposing the coating into silicon dioxide with heating or with application of water, or by the sol-gel process wherein a polyfunctional alkoxysilane is used.

EXAMPLE 1B

The transparent sheet used was a biaxially oriented polyethylene terephthalate film (hereinafter referred to as "PET film"), 125 μm in thickness, 400×1000 mm in size and 90% in Tt. The PET film was first pretreated over one surface thereof by glow discharge. The pretreated PET film was disposed as opposed to a copper target within the vacuum container of a magnetron sputtering apparatus, and the air in the container was replaced completely by argon to obtain a vacuum of $2 \times 10^{-3}$ torr, in which with application of DC electric power of 9 kW, the copper was deposited on the film at a rate of 1 m/min repeatedly three times.

A copper thin film was obtained with a uniform thickness of 0.12 μm. A portion of the film was cut off and bent through 180° for testing, but the copper thin film was unlikely to peel off.

The copper-deposited surface of the PET film obtained was then electrolytically plated with copper in a plating bath which was an aqueous solution of copper sulfate and sulfuric acid in mixture, under the conditions of a bath temperature of 23° C., a cathode current density of 1.7 A/dm² and a plating rate of 0.3 μm/min. The copper plating layer thus obtained had a uniform thickness of 2 μm. When a portion of the resulting sheet was cut off and bent through 180° for testing, the copper layer was unlikely to peel off the PET film as in the previous test.

Subsequently, the copper-plated PET film was photo-etched under the following conditions to convert the copper layer into a conductive reticular pattern.

The surface of the copper plating layer was first-coated with a resist of the positive type by a roll coater to a thickness of 2 μm. A masking positive film bearing an image of latticelike pattern having square openings, 15 μm in line width and 180 μm in pitch was then held in intimate contact with the resist coating under vacuum. The resulting sheet was thereafter exposed to light using an ultraviolet light source for irradiation with 130 mJ/cm². A jet of developer was then applied to the sheet to remove the resist from the exposed portions (lattice opening image portions), followed by washing with water. The sheet was then fixedly placed in the container of an etching apparatus and immersed in a hydrogen peroxide-sulfuric acid etchant at 20° C. with movement to etch away the portions of the copper plating layer corresponding to the exposed portions along with the underlying sputter-deposited copper layer for 2 minutes, followed by washing with water and drying. Finally the sheet was immersed (for 1 minute) in an aqueous solution of sodium hydroxide (5% in concentration) to remove the resist coating from the unexposed portion (lattice pattern image) for conversion to a copper pattern with square openings.

The surface of the pattern was thereafter oxidized under the following conditions for coloring. The PET film having the copper pattern was immersed for 5 minutes in a bath which was heated at 70° C. and which was an aqueous solution of sodium hydroxide and sodium chlorite in mixture. The film was then withdrawn, washed with water and dried. The surface of the copper pattern was oxidized to a blackish brown copper oxide layer. The colored copper oxide layer was 1 μm in thickness.

The colored copper pattern obtained was sharp and 14 μm in line width, and was an approximately 1:1 reproduction of the original pattern. Given in Table 2 are the results of measurement of Tt, opening ratio, electromagnetic wave shield properties, moire fringes and visibility.

FIG. 3 is a perspective view showing the structure of the transparent member obtained in this example for use as a shield against electromagnetic waves. The PET film is indicated at 21, the copper thin-film layer at 22 and the electrolytically plated copper thick-film layer at 23. These two layers substantially provide a copper pattern layer 2P. Indicated at 24 is the colored copper oxide layer.

TABLE 2

| Example | Opening Ratio of Copper Pattern (%) | Tt (%) | Electromagnetic wave shield property (dB) | | | Moire fringe | Visibility |
| --- | --- | --- | --- | --- | --- | --- | --- |
| | | | 100 MHz | 500 MHz | 1 GHZ | | |
| Ex. 1B | 84 | 76.0 | 38 | 37 | 38 | ◎ | Sharp image are easily visible |

TABLE 2-continued

| Example | Opening Ratio of Copper Pattern (%) | Tt (%) | Electromagnetic wave shield property (dB) | | | Moire fringe | Visibility |
| --- | --- | --- | --- | --- | --- | --- | --- |
| | | | 100 MHz | 500 MHz | 1 GHZ | | |
| Ex. 2B | 81 | 73.4 | 43 | 43 | 49 | ◎ | Sharp image are easily visible |
| Comp. Ex. 1B | 69 | 65.0 | 41 | 42 | 43 | x | Marked fringes low visibility |
| Comp. Ex. 2B | 49 | 46.8 | 56 | 51 | 52 | ○ | Some fringes Entire screen appears dark. |

EXAMPLE 2B

A copper-deposited PET film obtained by sputtering under the same conditions as in Example 1B was subjected to photolithography under the following conditions to produce an exposed lattice pattern with square openings. The copper-deposited surface was coated with a resist of the negative type by a roll coater to provide a resist layer with a thickness of 2 μm. A masking positive film bearing an image of lattice pattern having square openings, 15 μm in line width and 150 μm in pitch was then held in intimate contact with the resist layer under vacuum. The resulting sheet was thereafter exposed to the light of an ultraviolet light source at 110 mJ/cm². The resist was removed from the unexposed portion (lattice pattern image) with a developer, followed by washing with water.

Next, the copper-deposited portion of the exposed lattice pattern having square openings was electrolytically plated with copper to form a thick film of copper, using phosphorus-containing copper as the anode, the pattern as the cathode and an aqueous solution of copper sulfate and sulfuric acid in mixture as the plating bath, under the conditions of a bath temperature of 23° C., a cathode current density of 1.7 A/dm² and a plating rate of 0.3 μm/min. The PET film thus plated was thoroughly washed with water and dried. Finally, the remaining resist film was removed from the exposed portions (lattice opening image portions) with an aqueous solution of sodium hydroxide (5% in concentration), followed by washing with water and drying. The copper plating was 1 μm in thickness.

Subsequently, the PET film having the copper plating pattern and the copper-deposited layer was etched under the following conditions over the entire surface thereof. The PET film was fixedly placed in the container of an etching apparatus, and immersed in a hydrogen peroxide-sulfuric acid etchant at 20° C. with movement to etch away the copper-deposited portions of lattice opening image portions corresponding to the exposed portions. The etching was thus effected for 20 seconds and immediately discontinued upon removal of the copper-deposited portions, followed by washing with water and drying. The copper pattern with square openings thus obtained had a line width of 15 μm which was the same as that of the pattern image on the masking positive film, hence a 1:1 reproduction. The pattern layer had a total thickness of 1 μm Although the copper plating pattern is also etched at the same time, the result described indicates that copper-deposited layer in the lattice opening image portions is etched away in preference, and that the copper plating pattern remains substantially unetched (with no side etching).

The PET film having the resulting copper pattern was then held in contact with a sulfiding bath at 40° C. for 60 seconds, the bath being prepared by adding quick lime, casein and potassium sulfide to sulfur serving as the main component and dissolving the mixture in distilled water. The film was thereafter immediately withdrawn from the bath, washed with water and dried. The pattern was colored black, and the color was vivider and darker than in Example 1B. The sheet obtained was measured as to the same items as in Example 1B, with the results given in Table 2.

COMPARATIVE EXAMPLE 1B

A lattice pattern of copper having square openings was formed on a PET film under the same conditions as in Example 2B except that the masking positive film used had an image of the lattice pattern, 30 μm in line width and 180 μm in pitch. The copper pattern obtained was 29 μm in line width and 1 μm in overall thickness. Table 2 shows the other measurements obtained.

COMPARATIVE EXAMPLE 2B

A lattice pattern of copper having square openings was formed on a PET film under the same conditions as in Example 2B except that the masking positive film used had an image of the lattice pattern, 30 μm in line width and 100 μm in pitch. The copper pattern obtained was 29 μm in line width and 1 μm in overall thickness. Table 2 shows the other measurements obtained.

EXAMPLE 1C

The transparent sheet used was a biaxially oriented polyethylene terephthalate film (hereinafter referred to as "PET film"), 125 μm in thickness, 400×1000 mm in size and 90% in Tt. The PET film was first pretreated over one surface thereof by glow discharge. The pretreated PET film was disposed as opposed to ITO (target) within the vacuum container of a magnetron sputtering apparatus, and the ITO was sputtered under the following conditions to deposit a thin ITO film on the entire surface of the film.

Sputtering operation pressure . . . a vacuum of $2\times10^{-3}$ torr obtained by replacing the air in the vacuum container with argon gas containing 4.5% of oxygen Sputtering temperature . . . 90° C.

Sputtering time . . . 4 seconds

The ITO thin-film layer thus formed by sputter deposition was 200 Å in thickness, 400 Ω/□ in surface resistivity and 88.9% in Tt.

Next, the surface of the ITO thin film was coated with a photoresist of the positive type by a roll coater to a thickness of 2 μm. The coating was then irradiated with ultraviolet rays at an intensity of 130 mJ/cm$^2$, with a masking negative film held in intimate contact with the coating surface, the masking film bearing an image of lattice pattern having square openings, 15 μm in line width and 150 μm. The irradiated pattern portion corresponding to the pattern image was developed for removal.

Accordingly, the resist in the portions corresponding to the opening image portions remained masked. The resulting film will hereinafter be referred to as "ITO pattern PET film." Subsequently, the ITO pattern PET film was immersed first in a palladium electroless plating bath (product of Nikko Metal Plating Co., Ltd., Product No. CG-535A, 3 to 3.5 in pH) at room temperature for 1 minute, thoroughly washed, and then immersed in a nickel electroless plating bath (product of Nikko Metal Plating Co., Ltd., Product No. NICOM N, 4.5 to 5 in pH) at 70° C. for 5 minutes to form a nickel layer.

The palladium thus applied and the nickel layer thus formed provide a ground layer (in this case, 0.2 μm in thickness) for the electrolytic plating of copper to be performed subsequently. The presence of the ground layer permits the ITO pattern layer to bond to the copper plating thick-film layer to be formed, whereby a copper pattern of improved strength will be provided.

Accordingly, the provision of the ground layer is an example of pretreatment which is to be performed when the conductive transparent thin-film layer 32 to be formed over the entire area is formed from ITO as the lower layer. If the thin-film layer is prepared from a material other than ITO, a different pretreatment (which is not always conducted, or a different method may be resorted to) will be performed.

The resulting PET film having the ground layer on ITO pattern layer was then immersed in a plating bath wherein an aqueous solution of mixture of copper sulfate and sulfuric acid served as the cathode, with the ITO pattern layer serving as the anode, for electrolytic plating (2 A/dm$^2$ in cathode current density, and 0.28 μm/min in plating rate) at room temperature. The copper deposited by the plating was 1.1 μm in thickness. The film thus obtained will hereinafter be referred to as the "copper plating pattern PET film."

Next, the resist film remaining in the pattern opening portions of the copper plating pattern PET film was dissolved with acetone for removal, whereby a lattice copper pattern with square openings was formed as an upper layer on the ITO conductive transparent thin-film layer provided as a lower layer over the entire area of the PET film. The pattern obtained was 14 μm in line width. Table 3 shows other measurements as to electromagnetic wave shield properties, Tt and moire fringes.

Incidentally, the opening ratio was calculated from Equation 1.

TABLE 3

| Example | Cu pattern line width | | | Shield properties (attenuation, dB) | | | | Opening |
|---|---|---|---|---|---|---|---|---|
| Comp. Ex. | /pitch (μm) | ITO thin film | Tt % | 100 MHz | 500 MHz | 1000 MHz | Moire fringe | ratio (%) |
| Ex. 1C | 14/150 | Lower layer | 73.0 | 51 | 50 | 52 | ⊙ | 82.2 |
| Ex. 3C | 15/100 | Upper layer | 62.0 | 58 | 57 | 56 | " | 72.2 |
| | 15/150 | Upper layer | 72.7 | 53 | 52 | 54 | " | 81.0 |
| | 15/200 | Upper layer | 75.9 | 50 | 50 | 54 | " | 85.6 |
| | 15/250 | Upper layer | 77.3 | 47 | 49 | 56 | " | 88.3 |

TABLE 3-continued

| Example Comp. Ex. | Cu pattern line width /pitch (μm) | ITO thin film | Tt % | Shield properties (attenuation, dB) 100 MHz | 500 MHz | 1000 MHz | Moire fringe | Opening ratio (%) |
|---|---|---|---|---|---|---|---|---|
| C. Ex. 1C | 15/100 | No | 65.6 | 50 | 48 | 49 | " | 72.2 |
|  | 15/150 | " | 73.4 | 43 | 43 | 49 | " | 81.0 |
|  | 15/200 | " | 77.0 | 40 | 40 | 45 | " | 85.6 |
|  | 15/250 | " | 79.9 | 37 | 37 | 42 | " | 88.3 |
| C. Ex. 2C | No | Yes | 89.4 | 10 | 3 | 2 | " | 100 |
| C. Ex. 3C | 29.9/180 | Lower layer | 60.2 | 67 | 66 | 69 | X | 69.4 |

EXAMPLE 2C

The PET film having the square lattice copper pattern and prepared in Example 1C was oxidized under the following conditions to color the copper surface of the pattern to form a blackish brown colored layer 3.

The PET film was immersed in its entirety in a bath which was an aqueous solution obtained by dissolving a mixture of sodium hydroxide and sodium in water chlorite and which was heated to 70° C., then withdrawn from the bath, washed with water and dried. The copper pattern surface was oxidized to a blackish brown copper oxide layer. This colored layer was 0.8 μm in thickness. The resulting sheet and the sheet obtained in Example 1 were each attached to a PDP in suspension, and images on the screen were viewed through the sheet. Consequently the sheet of the present example made the viewer feel at ease the moment when the screen became visible, giving no feeling of visual fatigue even if the screen was watched further for a prolonged period of time.

No differences were found between the sheet of this example and that of Example 1 with respect to other properties, i.e., electromagnetic wave shield properties, Tt and moire fringes.

FIG. 6 shows the structure obtained in Example 1 as well as in Example 2. Indicated at 31 is a PET film, at 32 a transparent ITO thin-film layer formed as a lower layer over the entire surface of the film, at 33 a copper plating layer formed by electrolytic plating, and at 34 a blackish colored layer of copper oxide.

EXAMPLE 3C

Four pieces of the same PET film as used in EXAMPLE 1C were prepared and similarly pretreated by glow discharge. Each piece of PET film was disposed as opposed to a copper target within the vacuum container of a magnetron sputtering apparatus, and the air in the container was completely replaced by argon gas to obtain a vacuum of $2 \times 10^{-3}$ torr. Under this operation pressure and with application of electric power of 9 kW (DC), the copper was deposited on the film while causing the film to travel at a rate of 1 m/min. This procedure was repeated three times to deposit a copper thin-film layer having a thickness of 0.12 μm(±0.01).

A portion of each piece of film was cut off and bent through 180 deg for testing, but the thin-film layer was unlikely to peel off.

Next, the four pieces of PET film thus obtained were photolithographically treated over the surface of the copper thin film to form lattice patterns having square openings and different in opening ratio. More specifically, the thin film surface of each film piece was coated with a positive photoresist (photodecomposable type) to a thickness of 2 μm. Masking negative films, all 15 μm in line width but different in pitch, i.e., 100 μm, 150 μm, 200 μm and 250 μm, respectively, in pitch were prepared, and held in intimate contact with the coating surfaces of the respective film pieces under vacuum, followed by irradiation with an ultraviolet light source at 110 mJ/cm². The resist of the exposed pattern portion of each film piece was developed for removal by dissolving (with the resist remaining in intimate contact with the pattern opening portions).

Subsequently, the copper thin-film layer of the square lattice pattern formed on each piece of PET film obtained as above was electrolytically plated with copper under the following conditions to superpose a copper thick layer on the thin-film layer and form a copper pattern. Finally the resist film remaining in the pattern opening portions was removed by dissolving. With the pattern serving as the cathode, and with an aqueous solution of mixture of copper sulfate and sulfuric acid used as the plating bath and serving as the anode, the thin layer was electrolytically plated at a bath temperature of 23° C., current density of 1.7 A/dm² and plating rate of 0.3 μm/min. The four film pieces thus treated were all 2.5 μm in the thickness of the copper pattern resulting from the electrolytic plating.

Each of the four pieces of PET film having the copper pattern on the copper thin film was subsequently chemically etched under the following conditions to remove the copper thin-film layer from the pattern opening portions by dissolving. The PET film in its entirety was placed in position within an etching apparatus and held in contact with a hydrogen peroxide/sulfuric acid etchant at 20° C. for 30 seconds. The copper thin film was removed from the pattern opening portions by dissolving, whereupon the etching operation was discontinued, followed by washing with water and drying. The film pieces thus obtained were all 2.41 (±0.01) μm in the thickness of the resulting copper pattern. This thickness is not substantially different from the thickness (2.5 μm) before the etching. This is thought attributable to the following. The copper pattern portion is etched simultaneously with the copper thin film of the pattern opening portions, whereas there is a great difference between the two in thickness, and there occurs a difference between the two in the quality of film, with the result that the copper thin film is etched in preference.

The copper pattern was smaller than the one obtained by the process of Example 1 in the diminution of the line width and was reproduced in the ratio of 1:1. Next, quick lime, casein and potassium sulfide were admixed with sulfur serving as the main component, and the mixture was dissolved in distilled water. The copper pattern surface was held in contact with the solution serving as a sulfiding bath at 40° C. for about 60 seconds, then washed with water and dried. The surface was colored black, and the color was darker and vivider than that of the copper oxide layer of Example 2C.

Next, ITO was sputtered to form a coating over the entire surface of the colored copper pattern of each piece of PET film having the copper pattern thus colored. The sputtering operation was conducted under the same conditions as in Example 1c except that the sputtering time was 8 seconds. The ITO film deposited by sputtering was 410 Å in thickness and 300Ω/□ in surface resistivity.

Measurement was made of the four pieces of the films obtained with respect to the electromagnetic wave shield properties, Tt and moire fringe relative to the line width/pitch of the copper pattern formed. Table 3 shows the results.

COMPARATIVE EXAMPLE 1C

Four pieces of PET film were prepared which had different square copper patterns by forming the copper pattern on each piece under exactly the same conditions as in Example 3C with the exception of forming no ITO thin-film layer. Each of the film pieces obtained was checked in the same manner as in Example 3C, with the results given in Table 3.

COMPARATIVE EXAMPLE 2C

The same PET film as used in Example 1C was pretreated similarly by glow discharge, and ITO was deposited on the entire pretreated surface by sputtering under the same conditions as in Example 3C to form an ITO thin-film layer having the same thickness. The PET film obtained with the ITO transparent thin-film layer only formed thereon was checked in the same manner as in Example 3C. Table 3 shows the results.

COMPARATIVE EXAMPLE 3C

The procedure of Example 1C was performed to form an ITO thin-film layer over the entire surface of a PET film and a lattice copper pattern on the thin-film layer under the same conditions as in Example 1C with the exception of using a masking negative film having an image of square lattice pattern which was 30 μm in line width and 180 μm in pitch. The measurements obtained of the resulting sheet in the same manner as in Example 1C were shown in Table 3, which reveals moire fringes occurred.

Table 3 shows that exceedingly higher shield effectiveness against electromagnetic waves is produced by the combination of the copper pattern and the ITO thin film than when one of these layers is singly provided. Furthermore, synergistic effectiveness is available especially at electromagnetic wavelengths higher than 100 MHz. This is a surprising result.

With respect to the balance between the transparency and the shield properties, when the transparency is increased, the corresponding diminution in the wave shield properties is small. This indicates that the transparency can be increased without impairing the shield properties, which is a feature to be highly evaluated.

The present invention which provides the shield transparent members of the foregoing construction has the following advantages.

First Aspect of the Invention

The conductive reticular pattern of copper is formed over the transparent substrate with a thin-film layer of copper (or an alloy thereof) which is interposed therebetween and formed directly by sputtering or like technique, so that the pattern is bonded to the substrate with a high strength. The member is therefore resistant to bending or flexure, retaining the pattern against separation even when used at high temperatures or high humidities for a prolonged period of time.

Since the conductive copper pattern is directly formed as stated above without using adhesive or the like unlike the conventionally practice, the transparency remains free of impairment that would result from the use of such agent.

The electric resistivity of the conductive pattern required for giving high shield properties is in a narrower range, while copper is plated to a greater thickness. The member therefore exhibits electromagnetic wave shield effectiveness and has high transparency.

The shield transparent member of the invention can be prepared by the process according to Item 9, which involves no likelihood of side etching the pattern, assuring ease of fabrication and achieving a high yield.

The surface layer of the conductive reticular pattern can be colored brown to black with a copper oxide or copper sulfide. The presence of the colored layer leads to ease of viewing and diminishes visual fatigue even if the device equipped with the member is watched for a prolonged period of time.

Second Aspect of the Invention

The member of the invention has the structure described, hence the following advantages.

The transparent member of the invention for use as a shield against electromagnetic waves has high shield properties and transparency and is further given characteristics to obviate or diminish the occurrence of moire fringes conventionally experienced. The reticular copper pattern has a brown to black colored surface, which ensures improved visibility.

Because of these characteristics, the transparent member, when used as installed at the front side of screen of the PDP or the like, fully blocks the electromagnetic waves emitted by the PDP or like device or those to be received from outside, rendering the screen images visible distinctly and comfortably.

The shield transparent member is usable also for CRT and other electronic information devices besides PDP, rendering the interior of the device visible and blocking the electromagnetic waves emitted by the device or those conversely received from other device to prevent the waves from causing an erroneous operation.

Third Aspect of the Invention

A greater improvement is made in the effect to block electromagnetic waves than when the component layers are each singly provided (the copper pattern only, or conductive transparent thin-film layer only), and a synergistic improvement is achieved especially in a high electromagnetic wavelength region.

It has become possible to give improved transparency without impairing the shield effectiveness. This overthrows an antinomic relationship generally existing between the two properties.

The brown to black colored layer provided over the surface of the reticular copper pattern affords visibility. Further the moire fringes occurring especially in the case of lattice copper patterns having square or rectangular openings can be eliminated or diminished.

Because of these advantages described, the transparent member finds wider application for use as a shield against electromagnetic waves for PDP, CRT and other electronic devices which emit electromagnetic waves.

What is claimed is:

1. A transparent member for use as a shield against electromagnetic waves characterized in that an electrically conductive reticular pattern is provided on a substrate (1) by forming a thin-film layer (2) of copper or an alloy thereof on the substrate by physical thin film forming means and forming a copper thick-film layer (4) on the thin-film layer by plating means so as to give the member a total transmittance of at least 50%, the reticular pattern having an electric resistivity of up to 200 mΩ/□.

2. A transparent member for use as a shield against electromagnetic waves according to claim 1 wherein a brown to black colored layer (5) is further formed over the copper thick-film layer (4).

3. A transparent member for use as a shield against electromagnetic waves according to claim 2 wherein the colored layer (5) comprises a copper oxide or copper sulfide.

4. A transparent member for use as a shield against electromagnetic vaves according to claim 1 wherein the substrate (1) is a thermoplastic resin sheet having a total transmittance of at least 65%.

5. A transparent member for use as a shield against electromagnetic waves according to claim 1 wherein the physical thin film forming means is a sputtering process or ion plating process.

6. A transparent member for use as a shield against electromagnetic waves according to claim 1 wherein the plating means is an electrolytic plating process.

7. A transparent member for use as a shield against electromagnetic waves according to claim 1 wherein the copper or alloy thin-film layer (2) has a thickness of 100 to 2000 Å.

8. A transparent member for use as a shield against electromagnetic waves according to claim 1 wherein the copper thick-film layer (4) has a thickness of 1 to 10 μm.

9. A process for preparing a transparent member for use as a shield against electromagnetic waves according to claim 1 which process includes the following steps A to E:

Step A: the step of sputtering copper or an alloy thereof onto one surface of a sheet of thermoplastic resin having a total transmittance of at least 65% to form the thin-film layer having a thickness of 100 to 2000 Å;

Step B: the step of developing the thin-film layer by photolithography to expose the reticular pattern;

Step C: the step of electrolytically plating the reticular pattern with copper to form the copper thick-film layer having a thickness of 1 to 10 μm;

Step D: the step of removing remaining resist from opening portions of the reticular pattern; and Step E: the step of chemically etching the entire resulting surface to remove the thin-film layer of copper or alloy thereof from the opening portions of the reticular pattern by dissolving the thin-film layer of copper or alloy from the opening portions of the reticular pattern to obtain an electrically conductive reticular pattern comprising the thin-film layer of copper or alloy thereof formed by sputtering and the copper thick-film layer formed by electrolytic plating and superposed on the thin-film layer.

10. A process for preparing an electromagnetic wave shield transparent member according to claim 9 which further includes the following step F;

Step F: the step of oxidizing or sulfiding a copper surface of a resulting conductive reticular pattern to form a brown to black surface layer of a copper oxide or copper sulfide.

11. A transparent member for use as a shield against electromagnetic waves comprising a reticular copper pattern (2P) formed on a transparent sheet (21) and consisting predominantly of copper, wherein the reticular copper pattern (2P) has a line width of 1 to 25 μm and an opening ratio of 56 to 96% and wherein the reticular copper pattern (2P) comprises:

a copper thin-film layer (22) consisting predominantly of copper, said thin-film layer being formed by physical thin-film forming means and serving as a ground layer; and a copper thick-film layer (23) formed over the copper thin-film layer (22) by plating means.

12. A transparent member for use as a shield against electromagnetic waves according to claim 11 wherein a brown to black colored layer (24) is further formed on the surface of the reticular copper pattern (2P).

13. A transparent member for use as a shield against electromagnetic waves according to claim 12 wherein the brown to black colored layer (24) is selected from the group comprising a copper oxide and copper sulfide.

14. A transparent member for use As a shield against electromagnetic waves according to claim 11 wherein the transparent sheet (21) is a thermoplastic resin sheet having a total transmittance of at least 60% and a thickness of 0.05 to 5 mm.

15. A transparent member for use as a shield against electromagnetic waves according to claim 11 wherein the copper thin-film layer (22) consisting predominantly of copper has a thickness of 50 Å to 1 μm and the copper thick-film layer (23) has a thickness of 1 to 15 μm.

16. A transparent member for use as a shield against electromagnetic waves according to claim 11 wherein the reticular copper pattern (2P) has square or rectangular openings.

17. A transparent member for use as a shield against electromagnetic waves comprising a reticular copper pattern consisting predominantly of copper and an electrically conductive transparent thin-film layer extending along the entire area of the transparent member, which are formed over a transparent sheet so as to give a total transmittance of at least 50% to the transparent member, wherein a brown to black colored layer is further formed on the reticular copper pattern.

18. A transparent member for use as a shield against electromagnetic waves according to claim 17 wherein the brown to black colored layer (33) comprises a copper oxide or copper sulfide.

19. A transparent member for use as a shield against electromagnetic waves according to claim 17 wherein the transparent sheet is a thermoplastic resin sheet having a total transmittance of at least 60%.

20. A transparent member for use as a shield against electromagnetic waves according to claim 17 wherein the reticular copper pattern is a square or rectangular lattice pattern having a line width of 1 to 25 μm and an opening ratio of 56 to 96%.

21. A transparent member for use as a shield against electromagnetic waves according to claim 17 wherein the conductive transparent thin-film layer has a thickness of 100 to 1500 Å.

* * * * *

UNITED STATES PATENT AND TRADEMARK OFFICE
CERTIFICATE OF CORRECTION

PATENT NO. : 6,448,492 B1
DATED : September 10, 2002
INVENTOR(S) : Okada et al.

It is certified that error appears in the above-identified patent and that said Letters Patent is hereby corrected as shown below:

Drawings,
Replace Fig. 4 with drawing as shown below:

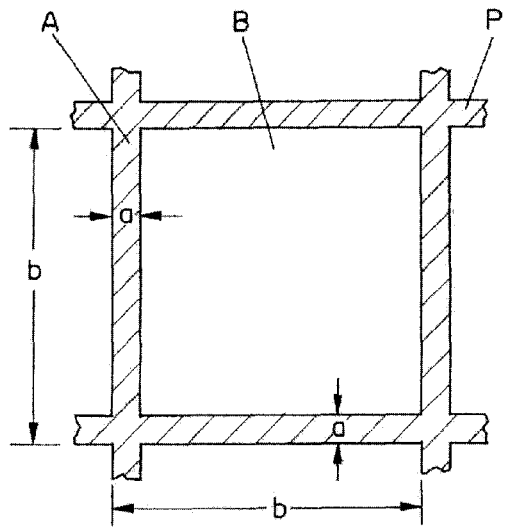

FIG. 4

Column 1,
Lines 25, 47, 49 and 67, "moire" should read -- moiré --
Line 57, "assure" should read -- ensure --

UNITED STATES PATENT AND TRADEMARK OFFICE
CERTIFICATE OF CORRECTION

PATENT NO. : 6,448,492 B1
DATED : September 10, 2002
INVENTOR(S) : Okada, et al

It is certified that error appears in the above-identified patent and that said Letters Patent is hereby corrected as shown below:

Column 2,
Lines 34, 39, 44, 49, 53 and 57, "1wherein" should read -- 1 wherein --
Line 61, "2wherein" should read -- 2 wherein --
Line 67, "1which" should read -- 1 which --

Column 3,
Line 25, "9which" should read -- 9 which --
Line 66, "Åto" should read -- Å to --

Column 4,
Line 31, "wide" should read -- width --
Line 42, "substrate-of" should read -- substrate of --
Lines 48 and 50, "olefine" should read -- olefin --

Column 6,
Line 19, "terminal" should read -- terminals --

Column 9,
Line 32, "is." should read -- is --

Column 11,
Line 25, "moire" should read -- moiré --; and "block" should read -- black --

Column 12,
Line 55, "the," should read -- the --

Column 13,
Line 42, "described-above" should read -- described above --
Line 50, "resulting-surface" should read -- resulting surface --

Column 14,
Line 45, "for-example" should read -- for example --

Column 15,
Line 56, "moire" should read -- moiré --

UNITED STATES PATENT AND TRADEMARK OFFICE
CERTIFICATE OF CORRECTION

PATENT NO. : 6448492 B1
DATED : September 10, 2002
INVENTOR(S) : Okada, et al

It is certified that error appears in the above-identified patent and that said Letters Patent is hereby corrected as shown below:

Column 16,
Line 4, "moire" should read -- moiré --
Line 15, "terephathlate" should read -- terephthalate --
Line 30, "type." should read -- type --

Column 18,
Line 7, "vivider" should read -- more vivid --

Column 19,
Line 13, "first-coated" should read -- first coated --
Line 46, "moire" should read -- moiré --
Table 2, "GHZ" should read -- GHz --
Table 2, "Moire" should read -- Moiré --; and "image" should read -- images --

Column 20,
Table 2-continued, "GHZ" should read -- GHz --
Table 2-continued, "Moire" should read -- Moiré --; and "image" should read -- images --
Line 62, "1 $\mu$m Although" should read -- 1 $\mu$m. Although --

Column 21,
Line 7, "vivider" should read -- more vivid --

Column 22,
Line 5, "150 $\mu$m." should read -- 150 $\mu$m in pitch. --
Line 47, "moire" should read -- moiré --
Table 3, "Moire" should read -- Moiré --

Column 23,
Table 3-continued, "Moire" should read -- Moiré --
Line 25, "sodium in water chlorite" should read -- sodium chlorite in water --
Line 39, "moire" should read -- moiré --

Column 25
Line 3, "vivider" should read -- more vivid --
Line 14, "moire" should read -- moiré --
Line 45, "moire" should read -- moiré --

UNITED STATES PATENT AND TRADEMARK OFFICE
CERTIFICATE OF CORRECTION

PATENT NO. : 6448492 B1
DATED : September 10, 2002
INVENTOR(S) : Okada, et al

It is certified that error appears in the above-identified patent and that said Letters Patent is hereby corrected as shown below:

Column 26,
Line 34, "moire" should read -- moiré --
Line 65, "moire" should read -- moiré --

Column 27,
Line 23, "vaves" should read -- waves --
Line 67, "F;" should read -- F: --

Column 28,
Line 26, "As" should read -- as --

Signed and Sealed this

Fifteenth Day of April, 2003

JAMES E. ROGAN
*Director of the United States Patent and Trademark Office*